United States Patent
Seawright et al.

(10) Patent No.: US 7,487,483 B2
(45) Date of Patent: Feb. 3, 2009

(54) CLOCK MODEL FOR FORMAL VERIFICATION OF A DIGITAL CIRCUIT DESCRIPTION

(76) Inventors: James Andrew Garrard Seawright, 400 W. Dana St., Mountain View, CA (US) 94041; Jeremy Rutledge Levitt, 1700 N. 1st St., #329, San Jose, CA (US) 95112; Christophe Gauthron, 562 Pettis Ave., Mountain View, CA (US) 94041

( * ) Notice: Subject to any disclaimer, the term of this patent is extended or adjusted under 35 U.S.C. 154(b) by 366 days.

(21) Appl. No.: 11/438,052

(22) Filed: May 18, 2006

(65) Prior Publication Data

US 2007/0271536 A1 Nov. 22, 2007

(51) Int. Cl.
G06F 17/50 (2006.01)
G06F 9/45 (2006.01)

(52) U.S. Cl. .............................. 716/6; 716/5
(58) Field of Classification Search ........................ None
See application file for complete search history.

(56) References Cited

OTHER PUBLICATIONS

Pfeifer et al., "Formal Verification for Time-Triggered CLock Synchronization," Dependable Computing for Critical Applications 7, 1999, pp. 207-226.*

* cited by examiner

*Primary Examiner*—Leigh Marie Garbowski
(74) *Attorney, Agent, or Firm*—Charles J. Kulas; Brian N. Young; Trellis IP Law Group, PC

(57) ABSTRACT

An edge clock model is used to capture states from a logic-level simulation of a circuit description. The states are captured at clock edges, or transitions, according to an edge clock model based on a clock specification for the circuit description. The captured states and associated attributes are used in formal verification of the circuit description. This approach helps to reduce or eliminate inaccuracies and other issues with other clock models such as a phase clock model. In one embodiment, a phase clock model can be used in addition to the edge clock model. In another embodiment, the edge clock states can be used to generate states according to different clock models, such as the phase clock model.

6 Claims, 5 Drawing Sheets

CLOCK MODEL FOR FORMAL VERIFICATION OF A DIGITAL CIRCUIT DESCRIPTION

BACKGROUND OF THE INVENTION

This invention relates in general to analysis of digital circuit designs and more specifically to a system for modeling clocks during digital circuit design verification.

Today's approaches to simulation, testing and verification of digital circuit designs typically use a hardware design language (HDL) description of a circuit, gate array or other electronic devices or components. Examples of HDLs include, e.g., Verilog, AHDL, VHDL, etc. Once an HDL description of the circuit exists the description can be used in test bench simulations and verification to determine whether the circuit design performs correctly.

Simulations allow a circuit description to be modeled at a very detailed level. Digital logic errors, or "exceptions," can be determined. Complex simulation and modeling also takes into account electrical, electromagnetic and other types of physical effects that could cause problems with the physical circuit once the circuit description is constructed. Due to the extremely large size of many of today's circuits (e.g., millions of transistors) and the enormously complex behavior of physical systems modeling, the sole use of highly detailed simulation and modeling can not be used to investigate all possible errors at all times for all states of a circuit.

One technique to make testing of hardware descriptions of large circuits feasible is called "verification." Verification can be achieved by formal verification methods which include exhaustive mathematical and analytical techniques. This allows logic errors to be detected without complex simulation and modeling. For example, if it is known that certain logic states should not occur in the design then the detection of such states during verification can be the basis for investigation as to how or why an exception state occurred.

Another use for verification is to determine states from which to perform additional analysis. For example, if an error condition occurs a short while after starting simulation from a specific initial state then it is useful to begin analysis at the specific state. Information about the error condition can be obtained more quickly, especially with complex modeling and simulation, by starting from the specific initial state rather than starting from an arbitrary state. However, determining, identifying, managing and searching states during verification is, itself, a huge and complex task.

One problem with accurately obtaining state information for formal verification is trying to model the clock specification of a circuit description. The clock specification describes all of the clocks in a system or device under test. It is critical to obtain correct initial state and then maintain proper clock timing to derive subsequent states.

SUMMARY OF EMBODIMENTS OF THE INVENTION

A preferred embodiment of the invention uses an edge clock model to capture states from a logic-level simulation of a circuit description for formal verification of a circuit description. The states are captured at clock edges, or transitions, according to an edge clock model based on a clock specification for the circuit description. The captured states can be used in verification or for other aspects of testing, simulation or analysis. This approach helps to reduce or eliminate inaccuracies and other issues with other clock models such as a phase clock model.

In one embodiment the invention provides a method for performing a formal verification of a circuit description, the method comprising: capturing state information by using clock edges from clock signals defined in the circuit description; and using the captured states in the formal verification.

In one embodiment, a phase clock model can be used in addition to the edge clock model. In another embodiment, the edge clock states can be used to generate states according to different clock models, such as the phase clock model. Various attributes describing characteristics of an edge clock state and the clock signals that generate it can be stored and used in the formal verification. The attributes can include characteristics of future clocks and that will cause a next state to occur.

DETAILED DESCRIPTION OF EMBODIMENTS OF THE INVENTION

Figure 1:
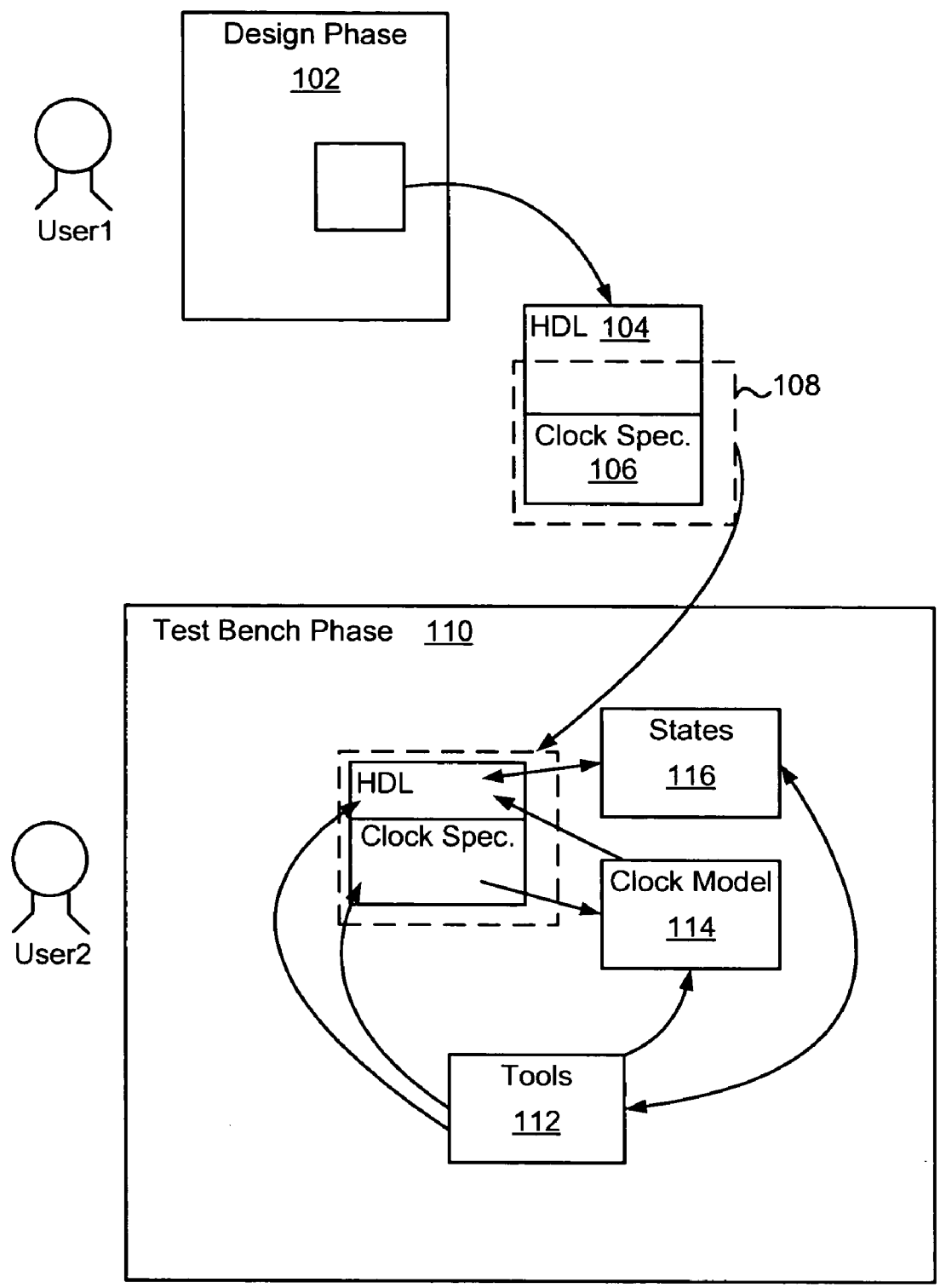
FIG. 1 shows a diagram of basic steps in a circuit design and verification process.

FIG. 1 shows a diagram of basic steps and components in circuit design and verification. In FIG. 1, a human designer or engineer (User1) uses various tools and resources at design phase 102 to create HDL description 104 of a circuit, device or system. HDL description 104 includes clock specification 106 that describes the clock signals used in the HDL description. Any of various hardware design languages can be used. The description can be at any level of detail. In a preferred embodiment of the invention the HDL provides an RTL description of a circuit but it should be apparent that features of the invention can work at other levels of simulation (e.g., gate, analog, etc.).

A portion of the HDL description along with the relevant part of the clock specification is identified as a device under test (DUT108) for verification and sent to test bench phase 110. For ease of description, details of phases such as design phase 102 and test bench phase 110 are omitted. As is known in the art, each phase can use many types of specialized tools in hardware or software for analysis, simulation modeling, construction, testing or other purposes. The test bench phase allows another human user, User2, to perform analysis such as simulation and verification on the DUT.

User2 uses tools 112 to create clock models 114. The clock models are designed to emulate the clocks in the clock specification of the DUT. Outputs from the clock models are used as signals to components modeled in the HDL and to cause state changes in the components. At specified times relative to changes in the clock signals, the current states are captured to state storage 116. States can be viewed, sorted, correlated, stored, searched, or otherwise manipulated. One use of the state information is to select a specific state as an initial state for a test run. The state information for the initial state is selectively loaded into the DUT and clocking can begin from that initial state forward for verification analysis.

The creation of an accurate and efficient clock model is critical to successful verification. Various embodiments of the invention are related to two different clock models, referred to herein as a "phase clock model" and an "edge clock model." A preferred embodiment of the invention uses an edge clock model for state capturing and also allows verification testing with states from both phase clock and edge clock models. Other embodiments can provide other clock models or can capture or use states from these models in different ways. These models are next discussed in turn.

Phase Clock Model

One approach to clock modeling is a phase clock model. The phase clock model uses a master clock and a phase counter to derive all other clocks in the clock specification of the DUT. States, or seeds, that are captured on the basis of the phase clock model are referred to as phase clock states to differentiate them from edge clock states that are generated or captured by edge clock models, which are discussed below.

In the phase clock model all of the clocks in the HDL description of the DUT are assumed to be synchronized and specified with a period, active edge, and optional waveform description. Note that other characteristics or attributes of clock specifications can be included in other approaches. Also, not all of these characteristics need be present in every embodiment. For example, a waveform description may not be required. Other characteristics can be assumed, such as an active edge being a positive (low-to-high voltage) transition. In general, any type of clock description that provides enough information to create a clock model is acceptable.

The clock specification is analyzed to determine the smallest time between significant clock edges and the minimum length for repeating clock patterns among groups of relevant clocks. The smallest time between significant clock edges can be the greatest common denominator of all the clock periods but can also be a more complicated value, formula or rule depending on clock characteristics (e.g., duty cycle variations, etc.). The minimum length repeating clock pattern is a period after which a known pattern among multiple clocks will repeat.

A master clock is used with a period equal to the smallest time possible between significant clock edges. A phase counter is clocked by the master clock and counts a number of cycles, N, equal to the minimum length repeating clock pattern, after which counting repeats. The master clock is aligned to the clocks in the clock specification so that each significant clock edge in a clocking pattern of the clocks in the clock specification occurs on a rising edge of the master clock.

Note that discussion of rising or falling edges, positive or negative signals or voltages, or other specific values, types or behaviors are only for purposes of description. For example, falling edges of clocks can be used with similar or the same results as rising edges. Also, although events such as clock edges are described herein as occurring at a "same" time or as a singular event, it should be apparent that satisfactory results may be obtained with signals changing at slightly different times, or within an acceptable time of other signals or events. Other embodiments can also use other ways to implement a phase clock model, such as by using two or more "master" clocks, or by using a phase counter that counts for greater than the minimum length repeating clock pattern. Other variations are possible.

Figure 2:
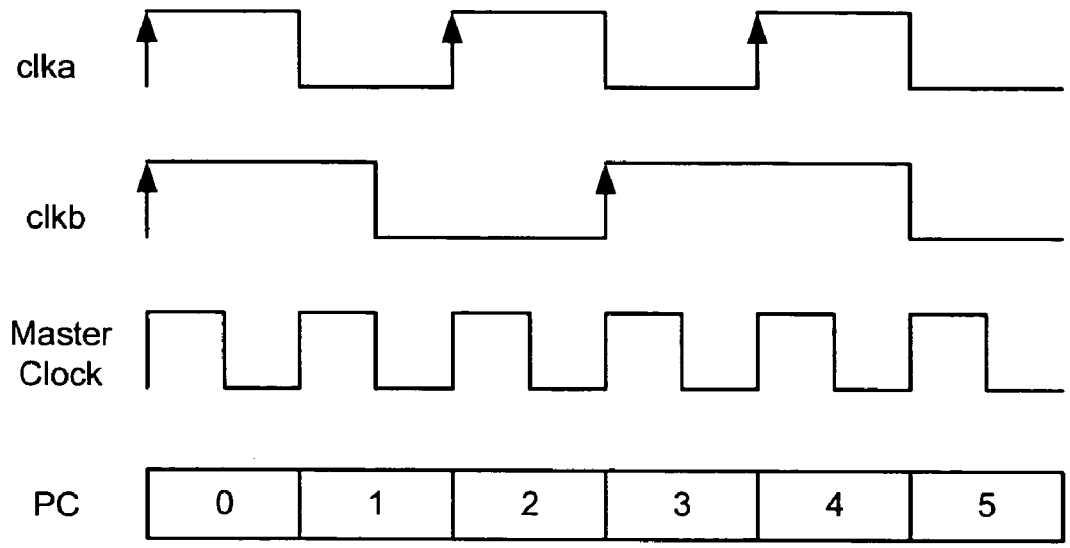
FIG. 2 shows a timing diagram illustrating a phase cock model.

FIG. 2 shows a timing diagram illustrating two clocks, clka and clkb, from a clock specification along with a master clock and phase counter used to model the specified clocks. The clocks from a clock specification, such as clka and clkb, are also referred to as the "design" clocks. In a formal verification mode each register is enabled to load at the particular phase count corresponding to the clock edge associated with the clock for that register. This load enable is implemented with a multiplexor controlled by clock phase logic that is described in HDL and compiled with the DUT HDL using tools at the test bench phase. Tables I and II, below, illustrate examples of HDL script that can be used to implement the clocking. Table I shows a design where register "ra" is clocked by "clka" and Table II shows a design where register "rb" is clocked by "clkb".

TABLE I always @(posedge clka) begin
    if (rst) begin
        ra <= 0;
    end else begin
        ra <= ra + 1;
    end
end

TABLE II always @(posedge clkb) begin
    if (rst) begin
        rb <=0;
    end else begin
        rb <= rb + 1;
    end
end The master clock and phase counter are synchronized with the design clocks using a control system similar to a phase-locked-loop. In a preferred embodiment, this control system is implemented in Verilog code generated by a compiler by using C code calls to library routines. In other embodiments other implementation approaches can be used. For example, any suitable type of language or format describing source or executable code can be employed. The functionality can be invoked by any suitable means including function or routine calls, interrupts, messaging, scheduling, etc. In general, the functionality of the present invention can be performed by any one or more processors or processes at the same or different locations and at the same or different points in time, as desired.

Figure 3:
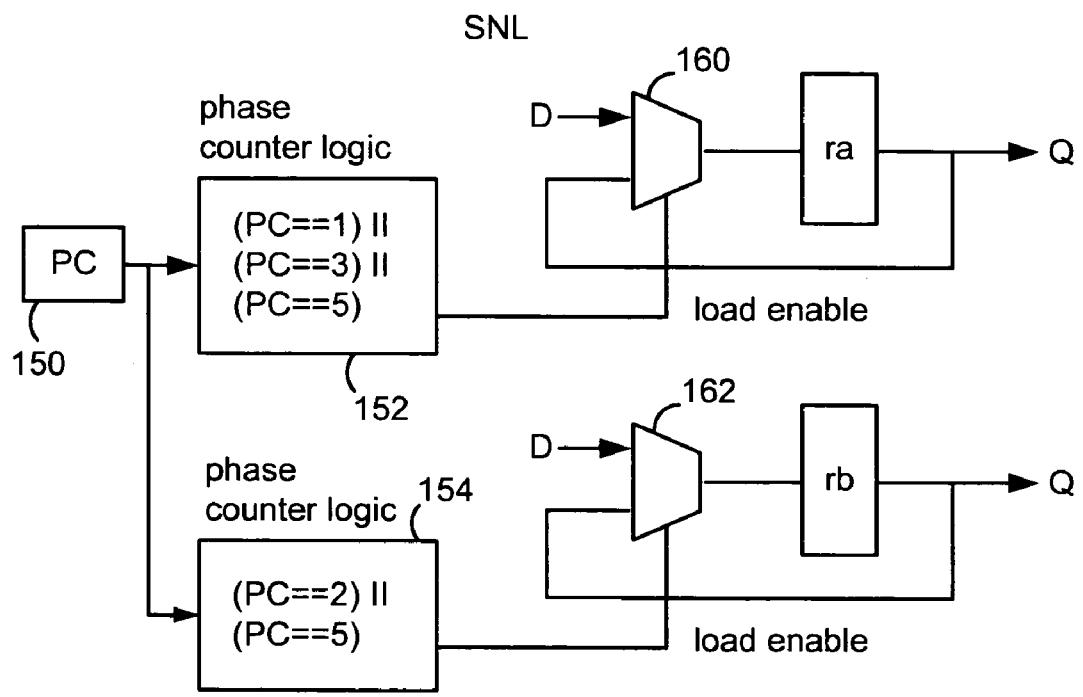
FIG. 3 shows a diagram of associated phase counter logic and load enable circuitry.

FIG. 3 shows a diagram of associated phase counter (PC) logic and load enable circuitry in the SNL. The count or output from phase counter 150 is provided as an input to counter logic blocks 152 and 154. Counter logic block 152 enables multiplexor 160 that selects data input D when its load enable is high, or "true." When selected, the data input, D, is provided to register ra. Otherwise the current output, Q, of register ra is provided as an input to the register so that its output does not change. Counter logic block 152 outputs a high signal at PC values of 1, 3 and 5. Thus, the data signal at D will be stored in register ra during PC values of 1, 3 or 5.

Similarly, counter logic block 154 outputs a high signal to latch the data input at multiplexor 162 into rb during PC values of 2 and 5.

Seed states can be captured by using the master clock and phase counter and detecting, or "peeking," the values of inputs just before the next master clock edge. This peeking is performed at each rising edge of the master clock by scheduling a call in the future using a delay of the current measured period of the master clock minus a setup time. Thus, the input signals associated with a master clock edge, t1, are obtained at a time, t2−x, just before the next master clock edge, where x is a small value.

Figure 4:
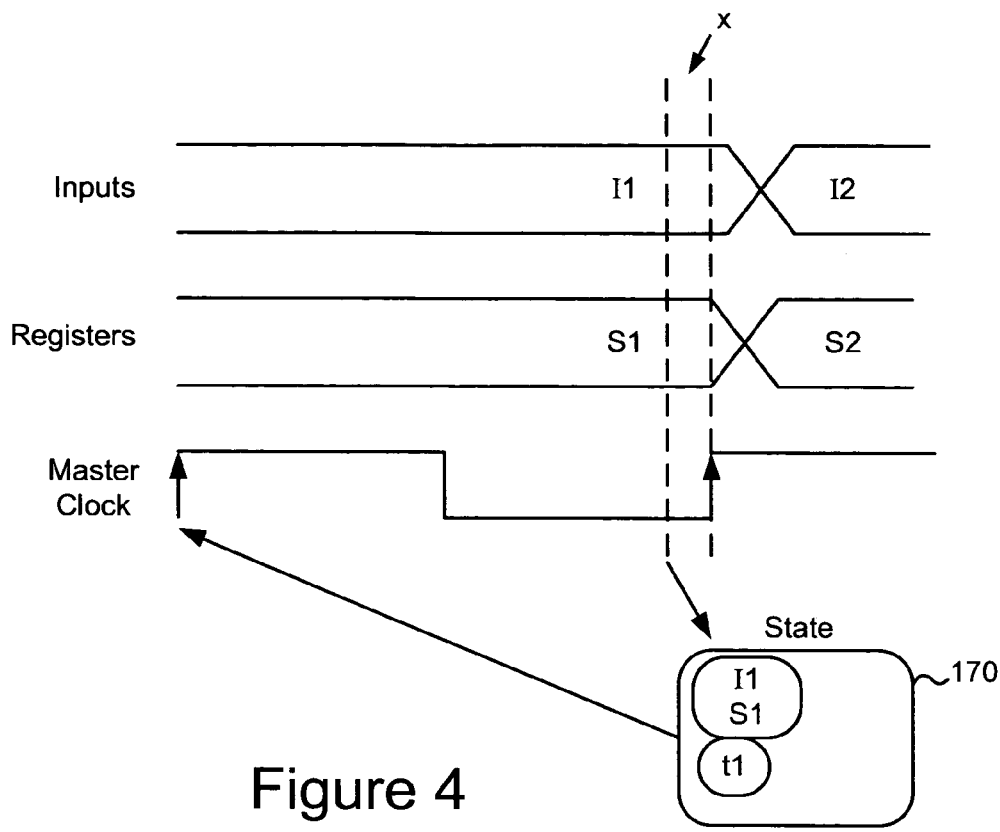
FIG. 4 illustrates peeking a state.

FIG. 4 illustrates peeking a state by detecting values at time t2−x. The peeked values are associated with an earlier master clock edge at time t1. The inputs change at time t2 from I1 to I2 values and registers change from S1 to S2 values. State 170 is saved in association with time t1 and includes values I1 and S1. With this approach, peeking can be performed at (i.e., just before) every edge of the master clock or only at edges of interest and the states can be used selectively in the verification process. In a preferred embodiment the peeking occurs before, but as close as possible to, clock edges. Describing a useful state of a system or subsystem of the DUT can include many hundreds, thousands or more, values stored in association with master clock times.

Figure 5:
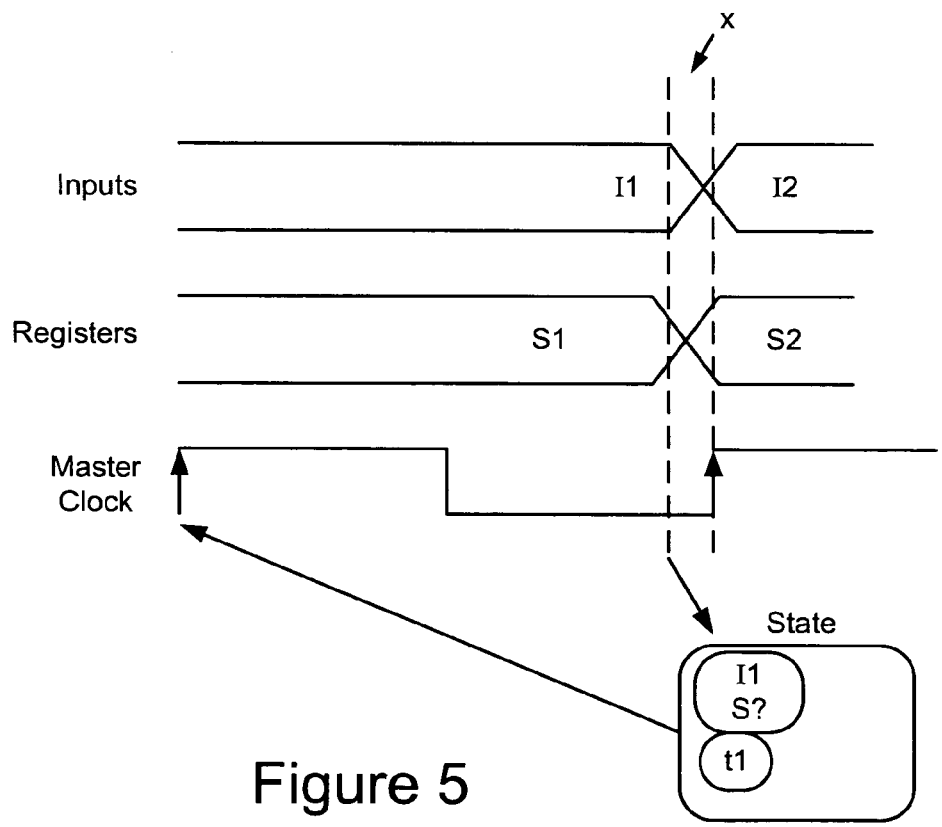
FIG. 5 shows the phase clock model of FIG. 4 with clock skew.

FIG. 5 shows the same phase clock model state capture as for FIG. 4 but the clock used for the inputs and registers is slightly skewed from the master clock. Skewing or other clock anomalies may occur if, for example, a user has specified clocks incorrectly. Clocks may also be skewed for testing or other diagnostics, etc. Thus, the state attempted to be peeked for t1 could obtain a wrong result for the values for the registers as indicated by "S?" in the state associated with t1.

Edge Clock Model

In a preferred embodiment, an edge clock model obtains state information at an active edge of a selected clock signal in the clock specification. Each system state is associated with one or more significant clock edges. The states are modeled at the time of the significant clock edge changes. The value stored for a state is the value at the last value change prior to the edge change. The captured states are associated with an indication of one or more clock changes of interest.

Figure 6:
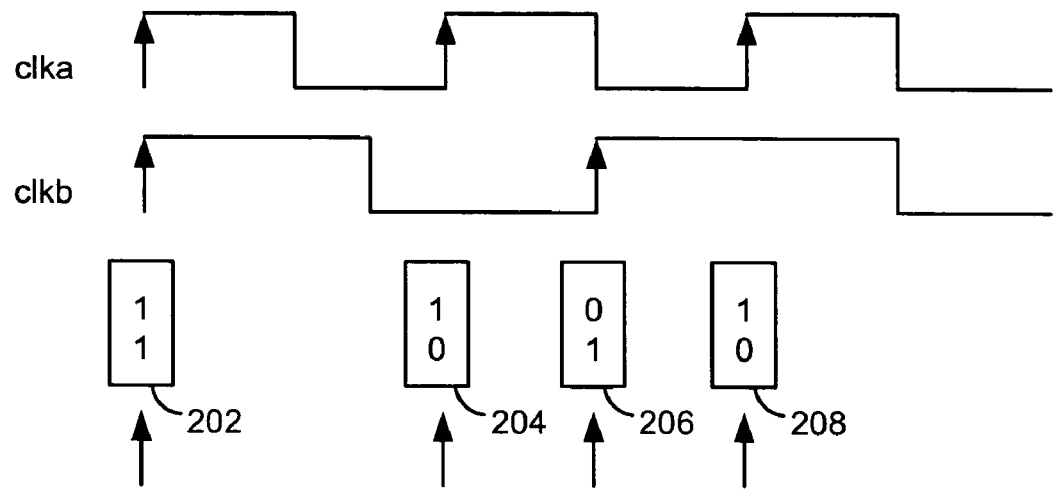
FIG. 6 illustrates state modeling in an edge clock model.

FIG. 6 shows how states are modeled in an edge clock model. Each edge of interest is associated with a clock edge change vector. Vector 202 is associated with both clka and clkb first edges since clka and clkb are properly synchronized and have their edge changes at the same time ("same" meaning within the step resolution of the simulation run). Vector 204 is associated with the second edge of clka, Vector 206 is associated with the second edge of clkb. Vector 208 is associated with the third edge of clka.

Any number and type of attributes may be associated with a clock edge or signal change. Typically a signal identifier, time identifier and signal change value will be stored. In a preferred embodiment, additional attributes shown in Table III are selectively stored in association with a signal change.

\*\*\*\*\*\*\* BEGIN TABLE III \*\*\*\*\*\*\*\*\*\*\*\*\*\*\*\*\*\*\*\*\*\*\*\*\*\*\*\*\*\*\*\*\*\*\*\*\*\*
STATE ATTRIBUTES
"clock_edge_vector" indicates which clock(s) will make significant changes to generate the _next_ state. The bv is of size 2\*num_clocks (two bits per clock). Even bits (2\*id) represent rising edge events. Odd bits (2\*id+1) represent falling edge events. Clocks are ordered in the vector by the clock id.
"clock_levels" represents the state of the clocks just prior to the next clock event (just prior to the application of the clock_edge_vector which generates the next state). The clock_levels are the equivalent to the clock values at the peek time in the old system. The bv is of size num_clocks and ordered by the clock ids.
"clock_edge_lowtime, clock_edge_hightime" represents the 64 bit time when the next significant event occurs (occurred in simulation). This is the time when the significant events in the clock_edge_vector are applied. This is a different time than the tb time. The tb time is the time when the current state register values were captured at the last significant clock event. The clock edge time is the time when they change to new values (next clock event).
"non_sig_tm_arr" is an array of zi_64bit_struct. This represents time values for possible non-significant clock edge events between the last state and the next state. If between the tb time (last -continued clock event) and the next clock edge time (the next clock event), a clock made a non-significant transition then the exact simulation time of this transition is recorded in the element location indexed by the clock id. If a clock did not make a non significant edge transition from the last clock edge time and the next clock edge time, then the value 0 is stored in the element location indexed by the clock id.
\*\*\*\*\*\*\*\*\* END TABLE III \*\*\*\*\*\*\*\*\*\*\*\*\*\*\*\*\*\*\*\*\*\*\*\*\*\*\*\*\*\*\*\*\*\*\*\*\*\*

Figure 7:
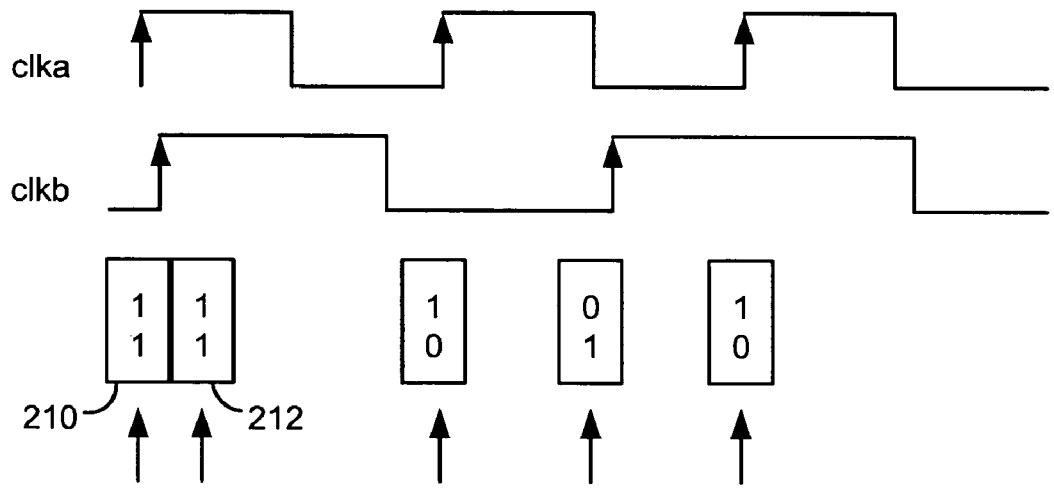
FIG. 7 the clock model of FIG. 6 with clock skew.

FIG. 7 shows the same clock signals as in FIG. 6 but with the presence of clock skew. Note that there are now two separate vectors, 210 and 212, for the first edges of clock signals clka and clkb, respectively, since these edge changes no longer occur at the same time. The edge clock model does not need to depend on the design clock period or waveform specification. Edge clock modeling can be used for any clocking pattern including patterns that change during the course of simulation. In cases where a repeating pattern is detected, however, analysis tools using edge clock modeling can also take advantage of the known repeating patterns to prove, for example, that certain conditions or operations will or will not cause an error condition.

In a preferred embodiment, seed states are captured using the edge based model and these states can be selectively used as initial states for simulation and verification. The mechanism to allow selective injection of seed states is to modify a search netlist to support both phase clock model and edge clock models. This allows netlist creation and transformation to be done using assumptions from the clock specification, and also allows the netlist and search to support states captured with clocks changing exactly as they occur in simulation—even if the clocks are not in agreement with the clock specification.

Figure 8:
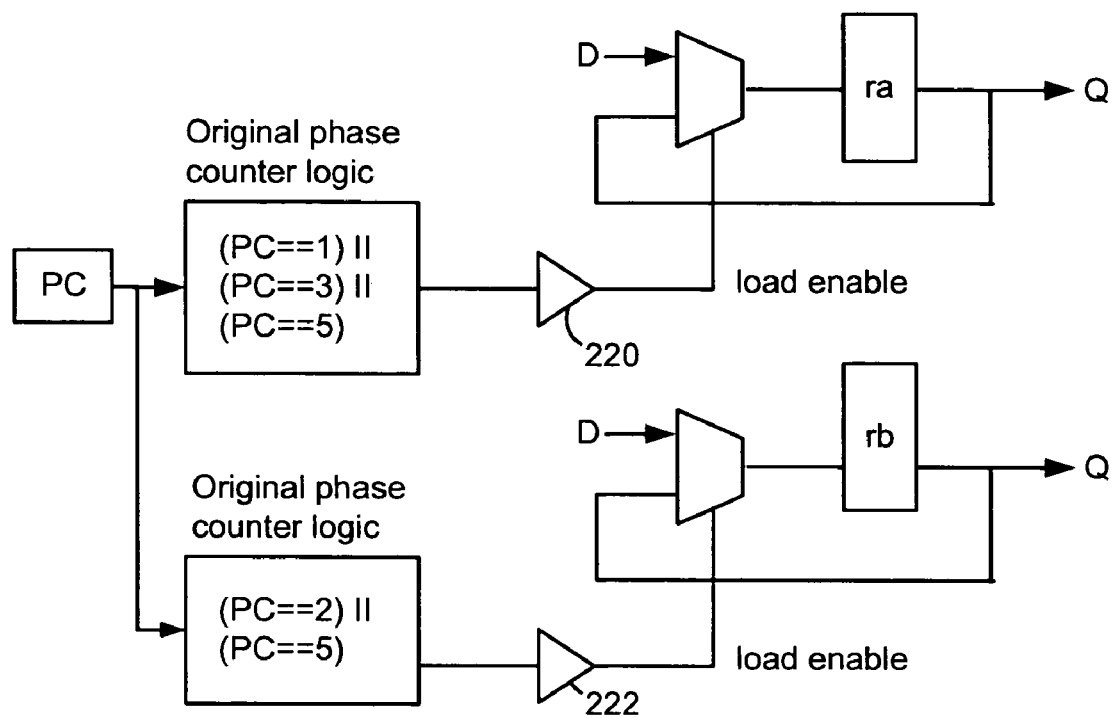
FIG. 8 shows insertion of clock enable buffer netlist objects.

FIG. 8 shows diagrammatically the insertion of clock enable buffer netlist objects 220 and 222 in the formal mode after the phase logic and just before the register load mux enable control. The buffer objects can be used as pass through buffers when it is desired to support the phase clock model, discussed above. Or the buffer objects can be used to directly apply state information from vectors of edge clock model state captures. This allows groups of registers associated with different significant clock edges to be independently applied with edge clock model vectors.

In an alternative embodiment, phase clock model states need not be captured. Rather, only edge clock vectors may be used in alternative embodiments. Some advantages of using the edge clock model may be that no clock model locking is required, state files can be designed to only store states with significant edge changes (e.g., not all phases); and the system need not be impacted by use of a clock multiplier and phase counter approach.

Although embodiments of the invention have been discussed primarily with respect to specific arrangements, formats, protocols, etc. any other suitable design or approach can be used. Specific details may be modified from those presented herein without deviating from the scope of the claims. The embodiments described herein are merely illustrative, and not restrictive, of the invention. For example, clock signals need not be the basis for state capture. Other signals, such as control signals, or events (e.g., externally generated signals), handshaking, state transition signals, etc., or signals derived from such signals, can be used as the basis for modeling and state capture.

Any suitable programming language can be used to with the present invention including C, C++, Java, PL/I, assembly language, etc. Different programming techniques can be employed such as procedural or object oriented. The routines can execute on a single processing device or multiple processors. Although the flowchart format demands that the steps be presented in a specific order, this order may be changed. Multiple steps can be performed at the same time. The flowchart sequence can be interrupted. The routines can operate in an operating system environment or as stand-alone routines occupying all, or a substantial part, of the system processing.

Steps can be performed by hardware or software, as desired. Note that steps can be added to, taken from or modified from the steps in the flowcharts presented in this specification without deviating from the scope of the invention. In general, the flowcharts are only used to indicate one possible sequence of basic operations to achieve a function.

In the description herein, numerous specific details are provided, such as examples of components and/or methods, to provide a thorough understanding of embodiments of the present invention. One skilled in the relevant art will recognize, however, that an embodiment of the invention can be practiced without one or more of the specific details, or with other apparatus, systems, assemblies, methods, components, materials, parts, and/or the like. In other instances, well-known structures, materials, or operations are not specifically shown or described in detail to avoid obscuring aspects of embodiments of the present invention.

As used herein the various databases, application software or network tools may reside in one or more server computers and more particularly, in the memory of such server computers. As used herein, "memory" for purposes of embodiments of the present invention may be any medium that can contain, store, communicate, propagate, or transport the program for use by or in connection with the instruction execution system, apparatus, system or device. The memory can be, by way of example only but not by limitation, an electronic, magnetic, optical, electromagnetic, infrared, or semiconductor system, apparatus, system, device, propagation medium, or computer memory.

A "processor" or "process" includes any human, hardware and/or software system, mechanism or component that processes data, signals or other information. A processor can include a system with a general-purpose central processing unit, multiple processing units, dedicated circuitry for achieving functionality, or other systems. Processing need not be limited to a geographic location, or have temporal limitations. For example, a processor can perform its functions in "real time," "offline," in a "batch mode," etc. Portions of processing can be performed at different times and at different locations, by different (or the same) processing systems.

Reference throughout this specification to "one embodiment," "an embodiment," or "a specific embodiment" means that a particular feature, structure, or characteristic described in connection with the embodiment is included in at least one embodiment of the present invention and not necessarily in all embodiments. Thus, respective appearances of the phrases "in one embodiment," "in an embodiment," or "in a specific embodiment" in various places throughout this specification are not necessarily referring to the same embodiment. Furthermore, the particular features, structures, or characteristics of any specific embodiment of the present invention may be combined in any suitable manner with one or more other embodiments. It is to be understood that other variations and modifications of the embodiments of the present invention described and illustrated herein are possible in light of the teachings herein and are to be considered as part of the spirit and scope of the present invention.

Embodiments of the invention may be implemented by using a programmed general purpose digital computer, by using application specific integrated circuits, programmable logic devices, field programmable gate arrays, optical, chemical, biological, quantum or nanoengineered systems, components and mechanisms may be used. In general, the functions of the present invention can be achieved by any means as is known in the art. Distributed, or networked systems, components and circuits can be used. Communication, or transfer, of data may be wired, wireless, or by any other means.

It will also be appreciated that one or more of the elements depicted in the drawings/figures can also be implemented in a more separated or integrated manner, or even removed or rendered as inoperable in certain cases, as is useful in accordance with a particular application. It is also within the spirit and scope of the present invention to implement a program or code that can be stored in a machine readable medium to permit a computer to perform any of the methods described above.

Additionally, any signal arrows in the drawings/Figures should be considered only as exemplary, and not limiting, unless otherwise specifically noted. Furthermore, the term "or" as used herein is generally intended to mean "and/or" unless otherwise indicated. Combinations of components or steps will also be considered as being noted, where terminology is foreseen as rendering the ability to separate or combine is unclear.

As used in the description herein and throughout the claims that follow, "a," "an," and "the" includes plural references unless the context clearly dictates otherwise. Also, as used in the description herein and throughout the claims that follow, the meaning of "in" includes "in" and "on" unless the context clearly dictates otherwise.

The foregoing description of illustrated embodiments of the present invention, including what is described in the Abstract, is not intended to be exhaustive or to limit the invention to the precise forms disclosed herein. While specific embodiments of, and examples for, the invention are described herein for illustrative purposes only, various equivalent modifications are possible within the spirit and scope of the present invention, as those skilled in the relevant art will recognize and appreciate. As indicated, these modifications may be made to the present invention in light of the foregoing description of illustrated embodiments of the present invention and are to be included within the spirit and scope of the present invention.

Thus, while the present invention has been described herein with reference to particular embodiments thereof, a latitude of modification, various changes and substitutions are intended in the foregoing disclosures, and it will be appreciated that in some instances some features of embodiments of the invention will be employed without a corresponding use of other features without departing from the scope and spirit of the invention as set forth. Therefore, many modifications may be made to adapt a particular situation or material to the essential scope and spirit of the present invention. It is intended that the invention not be limited to the particular terms used in following claims and/or to the particular embodiment disclosed as the best mode contemplated for carrying out this invention, but that the invention will include any and all embodiments and equivalents falling within the scope of the appended claims.

What is claimed is:

1. A method for obtaining state information from a hardware description, wherein the hardware description includes a clock specification of two or more clocks, the method comprising:

capturing phase clock states from the hardware description by using a master clock and a phase counter, wherein the master clock and phase counter are used to model the two or more clocks in the clock specification, wherein phase clock states are captured at a time after a transition of the phase counter;

capturing edge clock states from the hardware description in response to a transition of a clock in the clock specification and analyzing the hardware description based on the phase clock states and the edge clock states.

2. The method of claim 1, wherein the analysis includes verification.

3. The method of claim 1, wherein the hardware description is described in a hardware design language, the method further comprising:

modeling the master clock and the phase counter in the hardware design language.

4. The method of claim 1, further comprising:

selectively applying a phase counter state or an edge clock state.

5. The method of claim 4, wherein the hardware description is described in a hardware design language, the method further comprising:

modeling an output of a phase counter in the hardware design language; and modeling a clock enable buffer between the phase counter and an input to a register load multiplexer, wherein the clock enable buffer selectively allows application of an edge clock state or a phase clock state to the register load multiplexer.

6. The method of claim 5, wherein the clock enable buffer operates in a pass through state to allow phase clock states to be applied to the register load multiplexer.

* * * * *